(12) United States Patent
Liu et al.

(10) Patent No.: US 11,450,763 B2
(45) Date of Patent: Sep. 20, 2022

(54) IGBT POWER DEVICE AND FABRICATION METHOD THEREFOR

(71) Applicant: Suzhou Oriental Semiconductor Co., Ltd., Jiangsu (CN)

(72) Inventors: Wei Liu, Jiangsu (CN); Lei Liu, Jiangsu (CN); Zhendong Mao, Jiangsu (CN); Yuanlin Yuan, Jiangsu (CN)

(73) Assignee: Suzhou Oriental Semiconductor Co., Ltd., Jiangsu (CN)

( * ) Notice: Subject to any disclaimer, the term of this patent is extended or adjusted under 35 U.S.C. 154(b) by 278 days.

(21) Appl. No.: 16/966,071

(22) PCT Filed: Jan. 30, 2019

(86) PCT No.: PCT/CN2019/073915
§ 371 (c)(1),
(2) Date: Jul. 30, 2020

(87) PCT Pub. No.: WO2019/154219
PCT Pub. Date: Aug. 15, 2019

(65) Prior Publication Data
US 2021/0036135 A1 Feb. 4, 2021

(30) Foreign Application Priority Data
Feb. 9, 2018 (CN) .......................... 201810132904.8

(51) Int. Cl.
*H01L 29/739* (2006.01)
*H01L 29/08* (2006.01)
(Continued)

(52) U.S. Cl.
CPC ...... *H01L 29/7397* (2013.01); *H01L 29/0821* (2013.01); *H01L 29/407* (2013.01); *H01L 29/41708* (2013.01); *H01L 29/66348* (2013.01)

(58) Field of Classification Search
CPC ............. H01L 29/7397; H01L 29/0821; H01L 29/407; H01L 29/41708; H01L 29/66348; H01L 29/417; H01L 29/402
See application file for complete search history.

(56) References Cited

U.S. PATENT DOCUMENTS 9,859,407 B2  1/2018  Tang et al.
2007/0138547 A1 *  6/2007  Nakamura ........ H01L 29/66734
257/331

(Continued)

FOREIGN PATENT DOCUMENTS

CN  1705136 A  12/2005
CN  103035521 A  4/2013

(Continued)

OTHER PUBLICATIONS

International Search Report (PCT/ISA/210) and translation and Written Opinion (PCT/ISA/237) dated May 8, 2019, by the Chinese Patent Office as the International Searching Authority for International Application No. PCT/CN2019/073915.

(Continued)

*Primary Examiner* — Khaja Ahmad
*Assistant Examiner* — Pavel G Ivanov
(74) *Attorney, Agent, or Firm* — Buchanan Ingersoll & Rooney PC

(57) ABSTRACT

Provided is an IGBT power device. The device includes: a p-type collector region; an n-type drift region located above the p-type collector region; multiple first grooves, where a second groove is provided below each of the multiple first grooves; a gate structure located in the first groove and the second groove; a p-type body region located between two adjacent first grooves; an n-type emitter region located in the p-type body region; and an n-type hole charge blocking region located between two adjacent second grooves.

9 Claims, 4 Drawing Sheets

(51) Int. Cl.
  *H01L 29/417*    (2006.01)
  *H01L 29/66*     (2006.01)
  *H01L 29/40*     (2006.01)

(56) References Cited

U.S. PATENT DOCUMENTS

| | | | |
|---|---|---|---|
| 2015/0076554 A1* | 3/2015 | Laven | H01L 29/66348 438/138 |
| 2015/0144994 A1* | 5/2015 | Sung | H01L 29/7397 257/139 |
| 2015/0187922 A1* | 7/2015 | Song | H01L 29/42368 257/139 |

FOREIGN PATENT DOCUMENTS

| | | |
|---|---|---|
| CN | 104103694 A | 10/2014 |
| CN | 105789290 A | 7/2016 |
| CN | 205488135 U | 8/2016 |
| CN | 106252396 A | 12/2016 |
| CN | 106486530 A | 3/2017 |
| JP | 2014207326 A | 10/2014 |
| WO | 2017199679 A1 | 11/2017 |

OTHER PUBLICATIONS

Office Action dated Jul. 3, 2020 by the Chinese Patent Office for Application No. 201810132904.8.

Search Report by the Chinese Patent Office for Application No. 201810132904.8.

\* cited by examiner

IGBT POWER DEVICE AND FABRICATION METHOD THEREFOR

CROSS-REFERENCE TO RELATED APPLICATIONS

This is a National Stage Application, filed under 35 U.S.C. 371, of International Patent Application No. PCT/CN2019/073915, filed on Jan. 30, 2019, which claims priority to Chinese patent application No. 201810132904.8 filed on Feb. 9, 2018, contents of both of which are incorporated herein by reference in their entireties.

TECHNICAL FIELD

The present disclosure relates to the technical field of semiconductor power devices, for example, to an insulated gate bipolar transistor (IGBT) power device and fabrication method thereof.

BACKGROUND

The IGBT power device is a device formed by a metal oxide semiconductor (MOS) transistor and a bipolar transistor. An input electrode of the IGBT power device is the MOS transistor, and an output electrode of the IGBT power device is a PNP-type transistor. The IGBT power device integrates advantages of these two transistor devices, not only has advantages of low driving power and high switching speed of the MOS transistor, but also has advantages of low saturation voltage drop and high capacity of the bipolar transistor. The IGBT power device has been more and more widely used in modern power electronic technology, and especially, dominates the application of a high-frequency high-power transistor and a medium-power transistor.

A sectional structural diagram of an IGBT power device in the related art is shown in FIG. 1. The IGBT power device in the related art includes the followings formed in an n-type semiconductor substrate: a p-type collector region 1; an n-type field cutoff region 2 located above the p-type collector region 1; an n-type drift region 7 located above the n-type field cutoff region 2; a p-type body region 3; an n-type emitter region 4 located in the p-type body region 3; an n-type hole charge blocking region 8 located between the p-type body region 3 and the n-type drift region 7; and a gate structure for controlling turn-on and turn-off of the IGBT power device, where the gate structure includes a gate oxide layer 5 and a control gate 6. In the IGBT power device in the related art, the higher the doping concentration of the n-type hole charge blocking region 8 is, the less the forward conduction voltage drop and the shorter the turn-off time of the IGBT power device are. However, in the reverse bias state, a peak value of an electric field in the IGBT power device is located at the n-type hole charge blocking region 8, and the higher the doping concentration of the n-type hole charge blocking region 8 is, the less the breakdown voltage is. The influence of the doping concentration of the n-type hole charge blocking region 8 on the breakdown voltage of the IGBT power device limits the optimization of the forward conduction voltage drop and the turn-off time of the IGBT power device by adjusting the doping concentration of the n-type hole charge blocking region.

SUMMARY

The present disclosure provides an IGBT power device. The IGBT power device includes an n-type semiconductor substrate, and followings located in the n-type semiconductor substrate: a p-type collector region; an n-type drift region located above the p-type collector region; multiple first grooves, where a second groove is provided below each of the multiple first grooves, and an opening of the second groove is located at a bottom of the first groove; a gate oxide layer and a control gate located in the first groove; a field oxide layer and a shield gate located in the second groove; a p-type body region between two adjacent first grooves; an n-type emitter region located in the p-type body region; and an n-type hole charge blocking region located between two adjacent second grooves, where the height of the n-type hole charge blocking region gradually decreases from each of two side wall positions of the two adjacent second grooves to a middle position of the n-type hole charge blocking region.

In an embodiment, the n-type hole charge blocking region located between the two adjacent second grooves is divided into a first portion and a second portion by the p-type body region and the n-type drift region, an edge of the n-type hole charge blocking region contacted to the n-type drift region and the p-type body region is arc-shaped, and the width of a bottom portion of the p-type body region contacted to the n-type hole charge blocking region gradually decreases from up to bottom.

In an embodiment, the n-type hole charge blocking region located between the two adjacent second grooves is configured to separate the p-type body region and the n-type drift region, an edge of the n-type hole charge blocking region contacted to the n-type drift region and the p-type body region is arc-shaped, and the width of a bottom portion of the p-type body region contacted to the n-type hole charge blocking region gradually decreases from up to bottom.

In an embodiment, the IGBT power device provided by the present disclosure further includes an n-type field cutoff region located between the p-type collector region and the n-type drift region.

In an embodiment, the IGBT power device provided by the present disclosure further includes an n-type collector region located in the n-type semiconductor substrate, where the n-type collector region and the p-type collector region are horizontally and alternately arranged at a bottom of the n-type semiconductor substrate.

In an embodiment, the width of the bottom of the first groove is greater than the width of the opening the second groove.

In an embodiment, the control gate is located at a side wall position of the first groove, the gate oxide layer is located between a surface of the first groove and the control gate, the shield gate and the field oxide layer are extended upward into the first groove along the second groove, and the shield gate is isolated from the control gate through the field oxide layer.

In an embodiment, a portion of the shield gate in the second groove is electrically connected to the n-type emitter region, and a remaining portion of the shield gate in the second groove is electrically connected to the control gate.

The present disclosure provides a fabrication method of an IGBT power device. The fabrication method includes following steps: a mask layer is formed on an upper surface of an n-type semiconductor substrate; a position of a first groove is defined through photoetching, exposed mask layer is etched away, and an opening of the mask layer is formed in the mask layer; the n-type semiconductor substrate is etched by using the mask layer as a mask, multiple first grooves are formed in the n-type semiconductor substrate, and at the same time, the width of the first groove is enabled to be greater than the width of the opening of the mask layer by increasing horizontal etching; an n-type ion implantation is performed, and an n-type doped region is formed in the n-type semiconductor substrate below the first groove; thermal oxidation is performed, a gate oxide layer is formed on a surface of the first groove, and at this moment, the n-type doped region in the n-type semiconductor substrate below the first groove is diffused to form an n-type doped region with a larger doped region; a first conductive film layer is deposited, the first conductive film layer is etched back, and a control gate is formed at a side wall position of the first groove; and the n-type semiconductor substrate is etched by using the mask layer as the mask, and a second groove is formed below the first groove, where the second groove separates the diffused n-type doped region.

BRIEF DESCRIPTION OF DRAWINGS

To illustrate the technical schemes of embodiments of the present disclosure, the drawings need to be used in the description of the embodiments will be described below.

DETAILED DESCRIPTION

Figure 1:
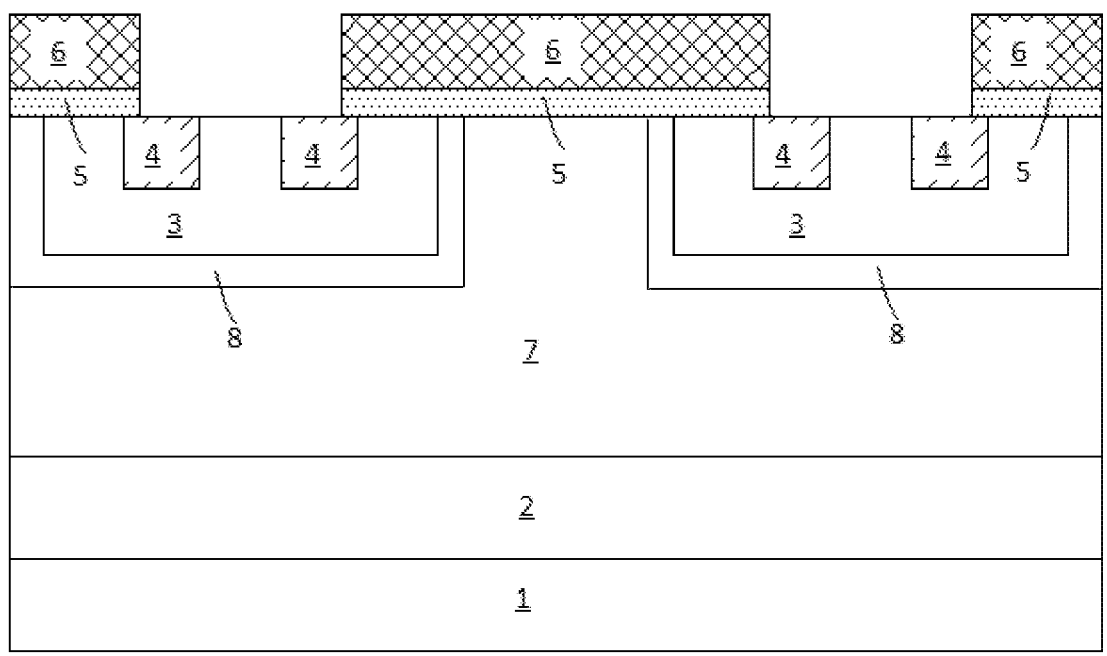
FIG. 1 is a sectional structural diagram of an IGBT power device in the related art.

The technical schemes of the present disclosure are described hereinafter through implementation modes in conjunction with the drawings of the embodiments.

The terms used in the present disclosure such as "having", "comprising" and "including" do not exclude the presence or addition of one or more other components or combinations thereof. Meanwhile, to illustrate the implementation modes of the present disclosure, diagrams listed in the drawings exaggerate the thickness of the layers and regions described in the present disclosure, and the size of the listed diagrams does not represent the actual size. The drawings are illustrative. The listed embodiments in the specification are not intend to limit specific shapes of the regions shown in the drawings, but include obtained shapes, for example, deviations due to fabrication.

Figure 2:
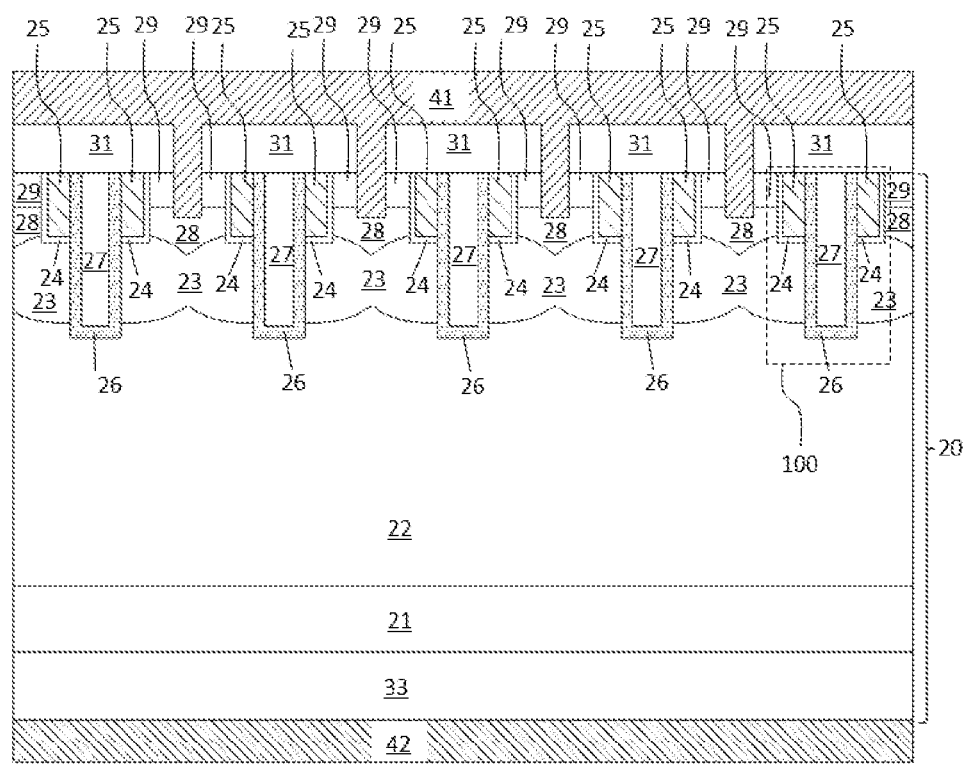
FIG. 2 is a sectional structural diagram of an IGBT power device according to an embodiment.
Figure 3:
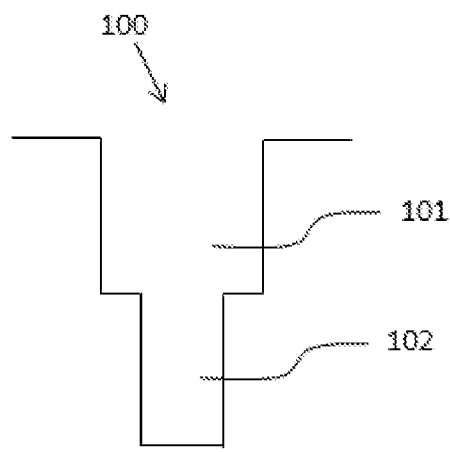
FIG. 3 is a showing diagram of a groove structure in a region 100 of the IGBT power device shown in FIG. 2.

FIG. 2 is a sectional structural diagram of an IGBT power device according to an embodiment. FIG. 3 is a showing diagram of a groove structure in a region 100 of the IGBT power device shown in FIG. 2. FIG. 3 shows structures of a first groove and a second groove in FIG. 2. As shown in FIGS. 2 and 3, the IGBT power device provided in this embodiment includes an n-type semiconductor substrate 20. The n-type semiconductor substrate 20 is usually a silicon substrate (including a silicon substrate and a silicon epitaxial layer formed on the silicon substrate). Followings are formed in the n-type semiconductor substrate 20: a p-type collector region 33 located at a bottom of the n-type semiconductor substrate 20, where the p-type collector region 33 is connected to a collector voltage through a metal collector electrode 42. An n-type field cutoff region 21 is located between the p-type collector region 33 and an n-type drift region 22, where the n-type field cutoff region 21 is an optional structure of the IGBT power device.

The IGBT power device provided in this embodiment further includes multiple first grooves 101 located in the n-type semiconductor substrate 20. A second groove 102 is provided below each of the multiple first grooves, and an opening of the second groove 102 is located at a bottom of the first groove 101. Structures of only five first grooves are exemplarily shown in FIG. 2. In an embodiment, the width of the opening of the second groove 102 may be less than or equal to the width of the bottom of the first groove 101. In FIGS. 2 and 3, it only exemplarily shows a structure in which the width of the opening of the second groove 102 is less than the width of the bottom of the first groove 101. When the width of the opening of the second groove 102 is equal to the width of the bottom of the first groove 101, the first groove 101 and the second groove 102 may be respectively regarded as upper portion and lower portion of the same groove.

The IGBT power device provided in this embodiment further includes followings formed in the n-type semiconductor substrate 20: a p-type body region 28 located between two adjacent first grooves 101, and an n-type emitter region 29 located in the p-type body region 28. The p-type body region 28 and the n-type emitter region 29 are connected to an emitter voltage through a metal emitter electrode 41.

The IGBT power device provided in this embodiment further includes the following formed in the n-type semiconductor substrate 20: an n-type hole charge blocking region 23 located between two adjacent second grooves 102. The height of the n-type hole charge blocking region 23 gradually decreases from each of two side wall positions of the two adjacent second grooves 102 to a middle position of the n-type hole charge blocking region 23. The doping concentration of the n-type hole charge blocking region 23 is greater than that of the n-type drift region 22. In FIG. 2, the n-type hole charge blocking region 23 located between two adjacent second grooves 102 is configured to separate the p-type body region 28 and the n-type drift region 22, an edge of the n-type hole charge blocking region 23 contacted to the n-type drift region 22 and the p-type body region 28 is arc-shaped, and the width of a bottom portion of the p-type body region 28 contacted to the n-type hole charge blocking region 23 gradually decreases from up to bottom. Since the edge of the n-type hole charge blocking region 23 contacted to the n-type drift region 22 and the p-type body region 28 is arc-shaped, in this case, the bottom of the p-type body region 28 is approximately V-shaped, as shown in FIG. 2.

The IGBT power device provided in this embodiment further includes the followings formed in the n-type semiconductor substrate 20: a gate oxide layer 24 and a control gate 25 located in the first groove 101; and a field oxide layer 26 and a shield gate 27 located in the second groove 102. In an embodiment, the control gate 25 is located at a side wall position of the first groove 101, the gate oxide layer 24 is located between a surface of the first groove 101 and the control gate 25, the shield gate 27 and the field oxide layer 26 are extended upward into the first groove 101 along the second groove 102, and the shield gate 27 is isolated from the control gate 25 through the field oxide layer 26, as shown in FIG. 2.

The control gate 25 is connected to a gate voltage through a metal gate electrode (based on a positional relationship of sections, the metal gate electrode is not shown in FIG. 2), so that the control gate 25 controls turn-on and turn-off of a current channel located inside the p-type body region 28 and between the n-type emitter region 29 and the n-type hole charge blocking region 23 through the gate voltage, to control turn-on and turn-off of the IGBT power device.

The shield gate 27 located in the second groove 102 may be connected to an independent metal shield gate electrode, or all the shield gates 27 may be connected to the metal emitter electrode 41, so that all the shield gates 27 are connected to the emitter voltage. In an embodiment, a portion of the shield gate 27 in the second groove 102 is electrically connected to the control gate 25 through the metal layer, that is, the portion of the shield gate 27 in the second groove 102 is connected to the gate voltage, so that the capacitance of the control gate 25 may be adjusted. At the same time, a remaining portion of the shield gate 27 in the second groove 102 is connected to the metal emitter electrode 41 through the metal layer, that is, the remaining portion of the shield gate 27 in the second groove 102 is connected to the emitter voltage, where this portion of the shield gate 27 may function as a field plate. Based on the positional relationship of the sections, a connection structure of the shield gate 27 with the n-type emitter region 29 and the control gate 25 in this embodiment is not shown in the drawings.

An interlayer insulating layer 31 is configured to isolate multiple metal electrodes. The interlayer insulating layer 31 is usually made of materials such as silicon glass, boron-phosphorosilicate glass or phosphorosilicate glass.

The IGBT power device provided in this embodiment may further include an n-type collector region formed at the bottom of the n-type semiconductor substrate 20. The p-type collector region 33 and the n-type collector region are horizontally and alternately arranged at the bottom of the n-type semiconductor substrate 20, and the p-type collector region 33 and the n-type collector region are connected to the collector voltage through the metal collector electrode.

Figure 4:
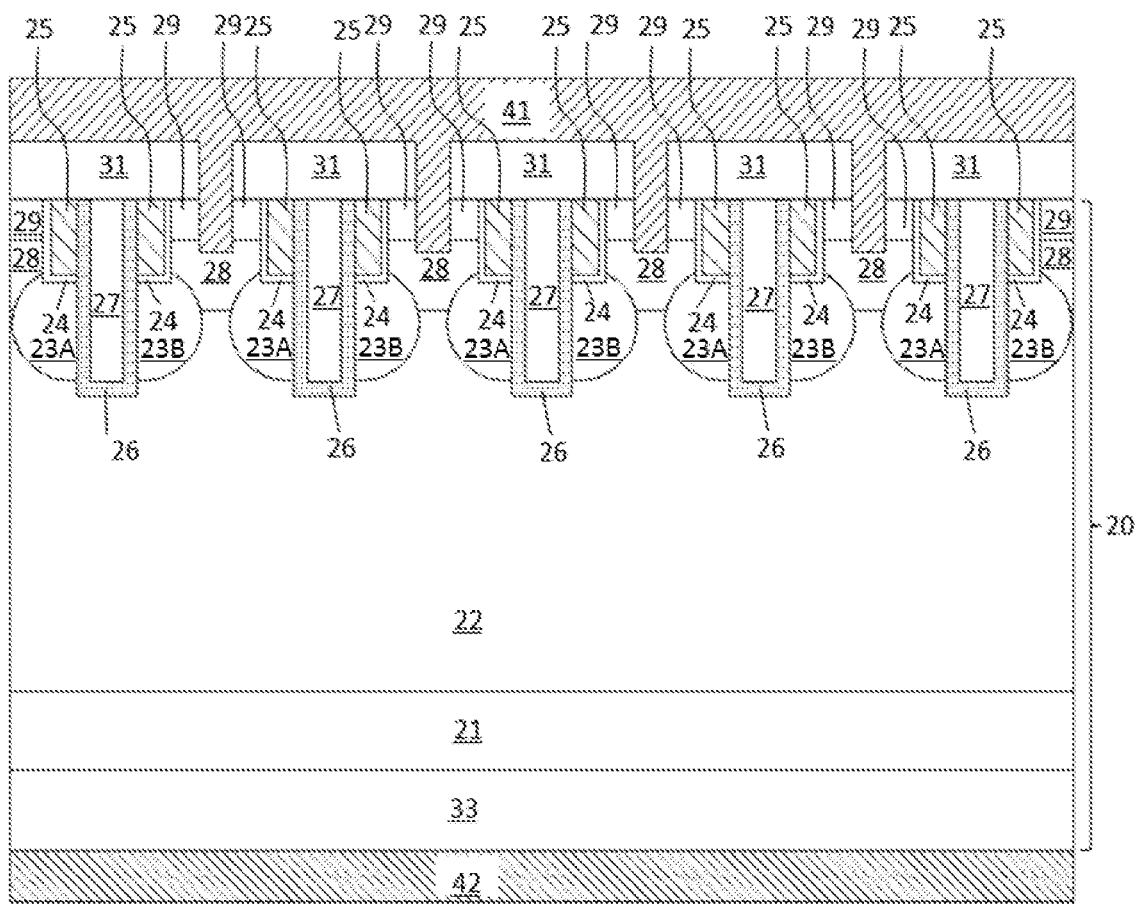
FIG. 4 is a sectional structural diagram of another IGBT power device according to an embodiment.

FIG. 4 is a sectional structural diagram of another IGBT power device according to an embodiment. Differences between the IGBT power device shown in FIG. 4 and the IGBT power device shown in FIG. 2 are that: in FIG. 4, the n-type hole charge blocking region 23 located between the two adjacent second grooves 102 is separated into a first portion 23A and a second portion 23B by the p-type body region 28 and the n-type drift region 22, the edge of the n-type hole charge blocking region 23 contacted to the n-type drift region 22 and the p-type body region 28 is arc-shaped, and the width of the bottom portion of the p-type body region 28 contacted to the n-type hole charge blocking region 23 gradually decreases from up to bottom.

In the IGBT power device provided in this embodiment, the width of the bottom portion of the p-type body region 28 contacted to the n-type hole charge blocking region 23 gradually decreases from up to bottom. In this structure, under the condition that the length of current channels on two sides in the p-type body region 28 in the IGBT power device are not shortened, the depth of the middle position of the p-type body region 28 may be increased, so that the base-ragion resistance and magnification factor of a parasitic NPN transistor in the IGBT power device can be reduced and the anti-latch-up effect of the IGBT power device can be improved.

According to the IGBT power device provided in the embodiment, when the shield gate 27 is connected to the emitter voltage, it functions as a field plate, and a position of a peak value of an electric field of the IGBT power device in a reverse bias state may be adjusted. When the IGBT power device provided in this embodiment in the reverse bias state, the peak value of the electric field is located a position between the n-type hole charge blocking region 23 and the n-type drift region 22 and close to the second groove 102, so when the doping concentration of the n-type hole charge blocking region 23 is increased to reduce a forward conduction voltage drop and turn-off time of the IGBT power device, a reverse breakdown voltage of the IGBT power device can be unaffected. That is, under the same breakdown voltage, the IGBT power device in this embodiment has a smaller forward conduction voltage drop and a shorter turn-off time.

Figure 5:
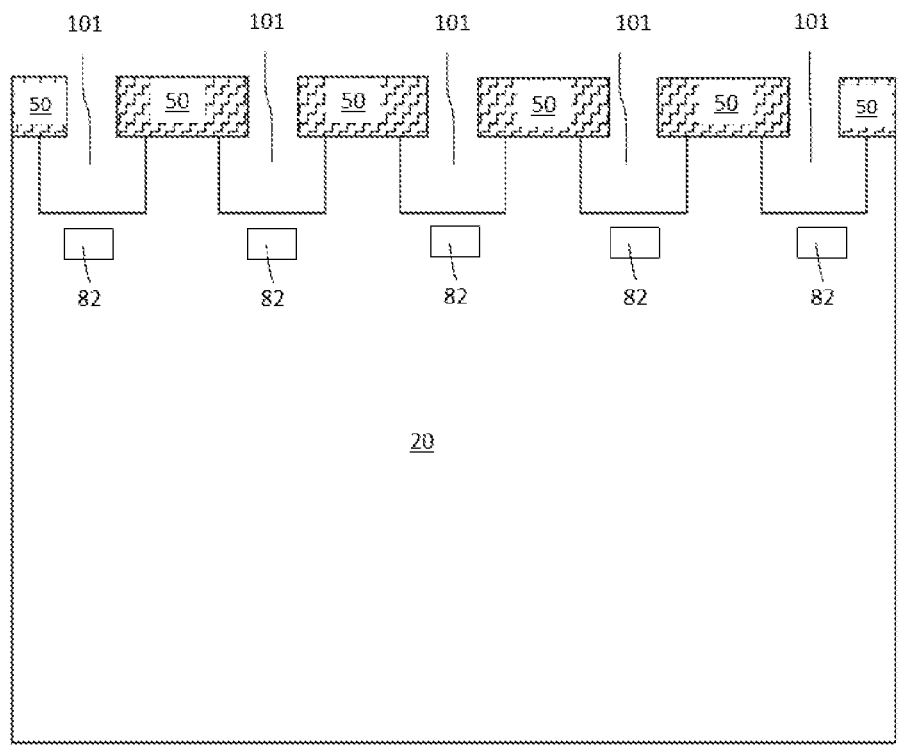
FIGS. 5 to 7 are fabrication process flowcharts of a fabrication method of an IGBT power device according to an embodiment.
Figure 6:
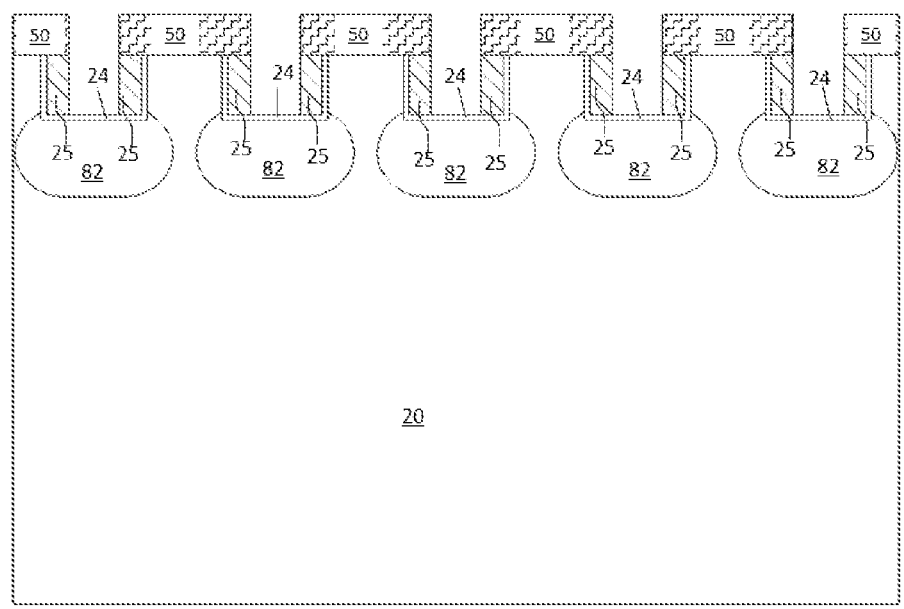
Figure 7:
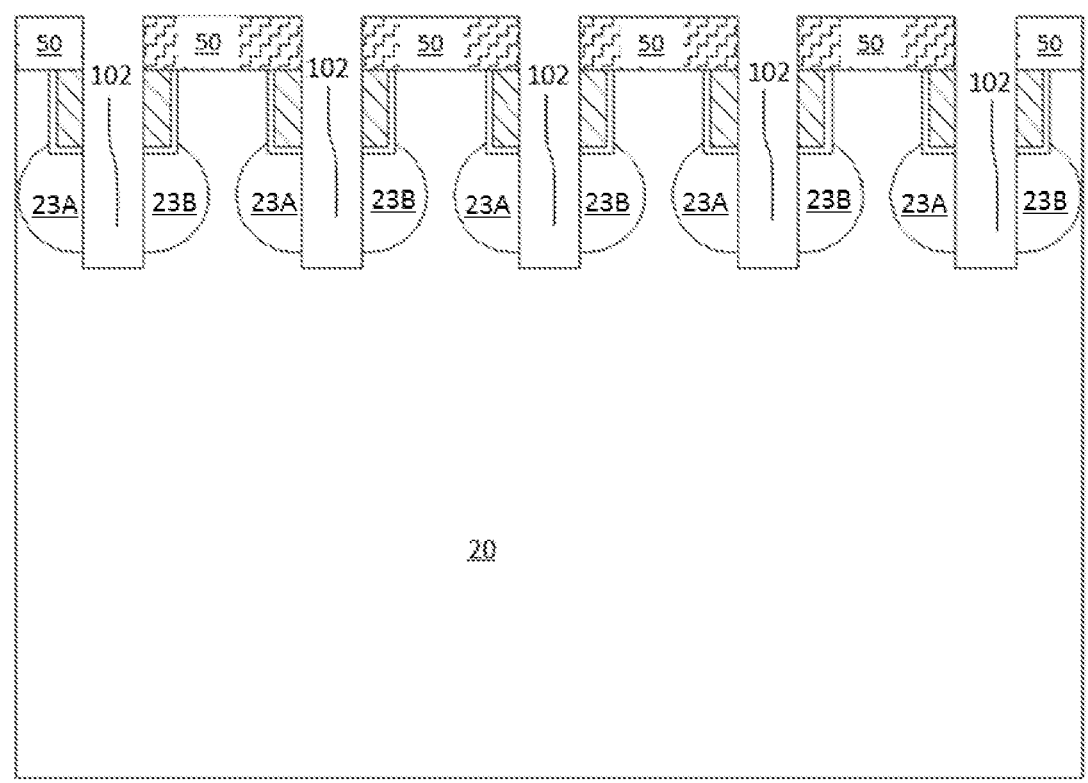

FIGS. 5 to 7 are fabrication process flowcharts of a fabrication method of an IGBT power device according to an embodiment. FIGS. 5 to 7 only exemplarily show the main structure of the IGBT power device in the fabrication process.

First, as shown in FIG. 5, the n-type semiconductor substrate 20 is provided. The n-type semiconductor substrate 20 is usually a silicon substrate (including a silicon substrate and a silicon epitaxial layer formed on the silicon substrate). A mask layer 50 is formed on an upper surface of the semiconductor substrate 20. The mask layer 50 generally includes a silicon oxide layer and a silicon nitride layer located above the n-type semiconductor substrate 20. After that, a position of the first groove 101 is defined by a photoetching, the mask layer 50 is etched, and the exposed mask layer 50 is etched away. An opening of the mask layer 50 is formed in the mask layer 50, so that the n-type semiconductor substrate 20 is exposed. Then the semiconductor substrate 20 is etched by using the mask layer 50 as a mask and multiple first grooves 101 (FIG. 5 only exemplarily shows structures of five first grooves 101) are formed in the n-type semiconductor substrate 20. When the n-type semiconductor substrate 20 is etched, by increasing horizontal etching to the n-type semiconductor substrate 20, the side wall position of the first groove 101 extends below the mask layer 50, so that the width of the first groove 101 is greater than the width of the opening of the mask layer 50. Next, the n-type ion implantation is performed, that is, n-type ions are implanted into the n-type semiconductor substrate 20 below the first groove 101, and an n-type doped region 82 is formed in the n-type semiconductor substrate 20 below the first groove 101. The doping concentration of the n-type doped region 82 should be greater than that of the n-type semiconductor substrate 20.

Since the side wall of the first groove 101 extends below the mask layer 50, when the n-type ion implantation is performed by using the mask layer 50 as a mask, n-type ions can be prevented from being implanted into the n-type semiconductor substrate 20 at the side wall position of the first groove 101 so as not to affect the current channel of the IGBT power device.

Next, as shown in FIG. 6, thermal oxidation is performed and the gate oxide layer 24 is formed on the surface of the first groove 101, and then a first conductive film layer is deposited and etched back and the control gate 25 is formed at the side wall position of the first groove 101. The control gate 25 is located below the mask layer 50. When the thermal oxidation is performed to form the gate oxide layer 24, the n-type ions of the n-type doped region 82 are diffused in the n-type semiconductor substrate 20, so that an n-type doped region 82 with a larger doped region is formed in the n-type semiconductor substrate 20. According to this embodiment, by controlling the implantation concentration and the implantation region of the n-type ions, controlling and the time and temperature of the thermal oxidation, left and right edges of the n-type doped region 82 after diffusion are arc-shaped. At the same time, the n-type doped regions 82 located below the two adjacent first grooves 101 may be connected together after the diffusion, or may not be connected. FIG. 6 shows an example that the n-type doped regions 82 below the two adjacent first grooves 101 are not connected together after the diffusion, and the doping concentration of the n-type doped region 82 should decrease from the position below the first groove 101 to the surrounding direction.

Next, as shown in FIG. 7, the exposed gate oxide layer 24 is etched away, the n-type semiconductor substrate 20 is etched by using the mask layer 50 as a mask and the second groove 102 is formed in the n-type semiconductor substrate 20, so that the opening of the second groove 102 is located below the first groove 101 and the width of the opening of the second groove 102 is less than the width of the bottom of the first groove 101. At the same time, the second groove 102 divides the n-type doped region 82 into multiple segments to form an n-type doped region located between two adjacent second grooves 102. The divided n-type doped region is the n-type hole charge blocking region 23 located between two adjacent second grooves 102. In FIG. 7, the n-type hole charge blocking region includes a first portion 23A and a second portion 23B.

After that, the IGBT power device of this embodiment may be fabricated according to the fabrication method of the IGBT power device in the related art. Edges of the first portion 23A and the second portion 23B of the n-type hole charge blocking region are arc-shaped, and the doping concentration of the n-type hole charge blocking region 23 is greater than that of the n-type drift region 22, so when p-type ion implantation is performed to form the p-type body region 28, the width of the bottom portion of the p-type body region 28 contacted to the n-type hole charge blocking region 23 gradually decreases from up to bottom.

What is claimed is:

1. An insulated gate bipolar transistor (IGBT) power device, comprising:
    an n-type semiconductor substrate, having a main surface, and comprising the following components located in the n-type semiconductor substrate:
    a p-type collector region;
    an n-type drift region located above the p-type collector region;
    a plurality of first grooves, wherein a second groove is provided correspondingly below each of the first grooves, and an opening of the second groove is located at a bottom of the first groove;
    a gate oxide layer and a control gate located in the first groove;
    a field oxide layer and a shield gate located in the second groove;
    a p-type body region located between two adjacent first grooves;
    an n-type emitter region located in the p-type body region; and
    an n-type hole charge blocking region located between two adjacent second grooves and being in direct contact with the p-type body region, wherein a height of the n-type hole charge blocking region, measured in a direction perpendicular to the main surface, gradually decreases from each of two side wall positions of the two adjacent second grooves to a middle position centered between the two adjacent second grooves.

2. The IGBT power device of claim 1, wherein
    the n-type hole charge blocking region located between the two adjacent second grooves is separated into a first portion and a second portion, so that the p-type body region and the n-type drift region form a direct contact, corresponding interfaces of the first portion and of the second portion of the n-type hole charge blocking region with the p-type body region and with the n-type drift region are arc-shaped, and a width of a bottom portion of the p-type body region, measured along a direction parallel to the main surface and perpendicular to the two adjacent second grooves, gradually decreases from top to bottom.

3. The IGBT power device of claim 1, wherein
    the n-type hole charge blocking region located between the two adjacent second grooves is continuous and separates the p-type body region from the n-type drift region,
    interfaces of the n-type hole charge blocking region contacting the n-type drift region and interfaces of the n-type hole charge blocking region contacting the p-type body region are each correspondingly arc-shaped, and a width of a bottom portion of the p-type body region where contacting to the n-type hole charge blocking region, the width measured along a direction parallel to the main surface and perpendicular to the two adjacent second grooves, gradually decreases from top to bottom.

4. The IGBT power device of claim 1, further comprising an n-type field cutoff region located between the p-type collector region and the n-type drift region.

5. The IGBT power device of claim 1, further comprising an n-type collector region located in the n-type semiconductor substrate, wherein the n-type collector region and the p-type collector region are horizontally and alternately arranged at a bottom of the n-type semiconductor substrate.

6. The IGBT power device of claim 1, wherein a width of the bottom of the first groove is greater than a width of the opening of the second groove.

7. The IGBT power device of claim 1, wherein the control gate is located at a side wall position of the first groove, the gate oxide layer is located between a surface of the first groove and the control gate, the shield gate and the field oxide layer are extended upward into the first groove along the second groove, and the shield gate is isolated from the control gate through the field oxide layer.

8. The IGBT power device of claim 1, wherein a portion of the shield gate in the second groove is electrically connected to the n-type emitter region, and a remaining portion of the shield gate in the second groove is electrically connected to the control gate.

9. A fabrication method of an insulated gate bipolar transistor (IGBT) power device, comprising:
    forming a mask layer on an upper surface of an n-type semiconductor substrate;
    defining positions of first grooves through photoetching, by etching exposed mask layer away, and forming openings in the mask layer;
    etching the n-type semiconductor substrate by using the mask layer as a mask, forming a plurality of first grooves in the n-type semiconductor substrate, and at the same time, enabling a width of each of the first grooves to be greater than a width of the opening of the mask layer by increasing horizontal etching;
    performing n-type ion implantation, to form an n-type doped region in the n-type semiconductor substrate correspondingly below each of the first grooves;
    performing thermal oxidation, to form a gate oxide layer on a surface of each of the first grooves, and simultaneously the n-type doped region in the n-type semiconductor substrate below each of the first grooves being diffused to correspondingly form a diffused wider n-type doped region;

depositing a first conductive film layer, etching back the first conductive film layer, and forming a control gate at a side wall position of each of the first grooves; and etching the n-type semiconductor substrate by using the mask layer as the mask, and correspondingly forming a second groove below each of the first grooves, wherein the second groove intersects the diffused wider n-type doped region.

* * * * *